United States Patent [19]
Ochii et al.

[11] Patent Number: 4,958,316
[45] Date of Patent: Sep. 18, 1990

[54] STATIC RANDOM ACCESS MEMORY

[75] Inventors: Kiyofumi Ochii, Yokohama; Masataka Matsui, Tokyo; Osamu Ozawa, Yokohama, all of Japan

[73] Assignee: Kabushiki Kaisha Toshiba, Kawasaki, Japan

[21] Appl. No.: 288,199

[22] Filed: Dec. 22, 1988

[30] Foreign Application Priority Data

Dec. 23, 1987 [JP] Japan .................................. 62-325688

[51] Int. Cl.⁵ .............................................. G11C 13/00
[52] U.S. Cl. ............................................. 365/63; 365/51
[58] Field of Search ...................... 365/63, 154, 52, 51, 365/174, 182

[56] References Cited

U.S. PATENT DOCUMENTS

4,727,518 2/1988 Madland .............................. 365/226

Primary Examiner—Terrell W. Fears
Attorney, Agent, or Firm—Finnegan, Henderson, Farabow, Garrett, and Dunner

[57] ABSTRACT

A static random access memory comprising a semiconductor substrate, a well region formed in the substrate and containing at least one memory cell, and a power-supply terminal connected to the well region, for applying a given bias voltage to the well region.

8 Claims, 8 Drawing Sheets

FIG. 1

| MEMORY CAPACITY | 256M | 1M | 4M | 16M |
|---|---|---|---|---|
| RESISTANCE | 1 TERA Ω | 4 TERA Ω | 16 TERA Ω | 64 TERA Ω |

STATIC RANDOM ACCESS MEMORY

BACKGROUND OF THE INVENTION

1. Field of the Invention

The present invention relates to a static random access memory having high-resistance elements made of polycrystalline silicon and used as load elements within memory cells, and more particularly, to a static random access memory provided with a means for detecting defective memory cells having leakage current, if any.

2. Description of the Related Art

An E/R type static random-access memory cell (E/R type SRAM cell) is known. As is understood from the equivalent circuit diagram shown in FIG. 1, this memory cell comprises a flip-flop circuit. The flip-flop circuit is comprised of two inverters, each having one high-resistance element which is used as a load element, and one enhancement type MOS transistor which functions as a drive element. The input and output of the first inverter are connected to the output and input of the second transistor, respectively. More specifically, high-resistance elements R1 and R2 are coupled, at one end, to power-supply voltage $V_{CC}$, and at the other end, to the drains of MOS transistors Q1 and Q2, respectively. The sources of MOS transistors Q1 and Q2 are ground voltage $V_{SS}$. The gate of transistor Q1 is coupled to the drain of transistor Q2, and the gate of transistor Q2 is coupled to the drain of transistor Q1. Hence, high-resistance elements R1 and MOS transistor Q1 form an inverter, and high-resistance elements R2 and MOS transistor Q2 form another inverter. These inverters have their input and output connected to each other's output and input, respectively, whereby the inverters constitute flip-flop circuit F.

Figure 1:
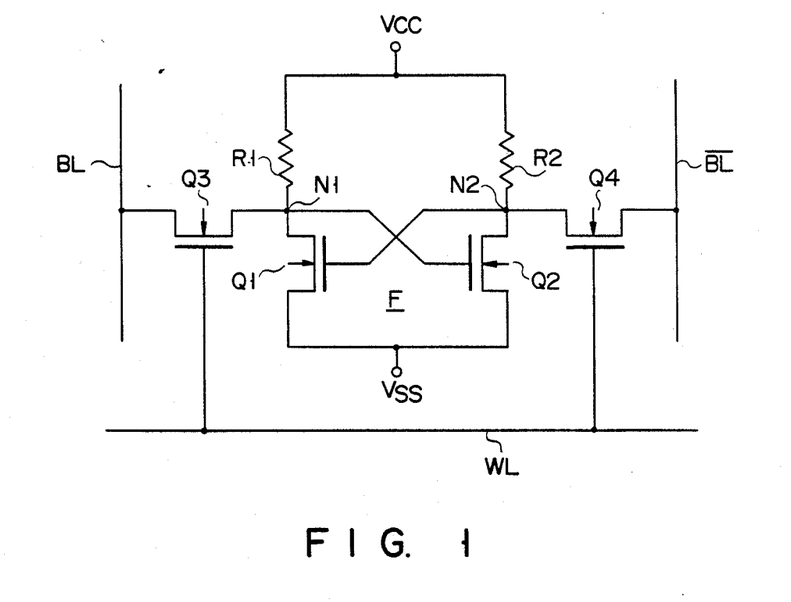
FIG. 1 is an equivalent circuit diagram showing an E/R-type SRAM cell.

As is illustrated in FIG. 1, MOS transistors Q3 and Q4 are used as transfer gates for controlling data-writing and data-reading. MOS transistor Q3 is connected between memory node N1 of flip-flop circuit F and bit line BL. MOS transistor Q4 is coupled between memory node N2 of flip-flop circuit F and bit line $\overline{BL}$. The gate of both MOS transistors Q3 and Q4 are coupled to word line WL. All transistors Q1 and Q4 are of enhancement type.

The flip-flop circuit F, which is the main component of the memory cell, is a bistable one. Therefore, two data items complemental to each other are stored in memory nodes N1 and N2. Assuming that data items, i.e., "1" and "0", are stored in nodes N1 and N2, respectively, transistor Q1 is off, and transistor Q2 is on. Since high-resistance elements R1 and R2 are linear passive elements, a current flows through high-resistance element R2 coupled to transistor Q2 which is on. The resistance of high-resistance element R2 is far higher than that of on-resistance of transistor Q2. Hence, the resistance of element R2 determines the value of the current flowing through transistors Q2. A similar current flows in each of the E/R type SRAM cells forming a static random access memory (SRAM), and the sum of the currents flowing through all E/R type SRAM cells determines the SRAM in its static condition.

Also well known are completely CMOS SRAM cells, each comprising six transistors, two of which are P-channel MOS transistors functioning as load elements. The two P-channel MOS transistors, which are used as load elements, are active elements. Therefore, the memory cell of FIG. 1 can be made of four MOS transistors and two resistors, and occupies but less area than a fully CMOS memory cell. However, this memory cell is disadvantageous in that a current flows via both high-resistance elements R1 and R2 as long as the cell is in the static condition. To reduce this current flowing through elements R1 and R2, these high-resistance elements can be replaced with resistors which have higher resistances. However, when elements R1 and R2 are replaced by such resistors, the flip-flop F may operate unstably, inevitably destroying the data stored in the E/R type SRAM cell, as will be explained below.

Figure 2:
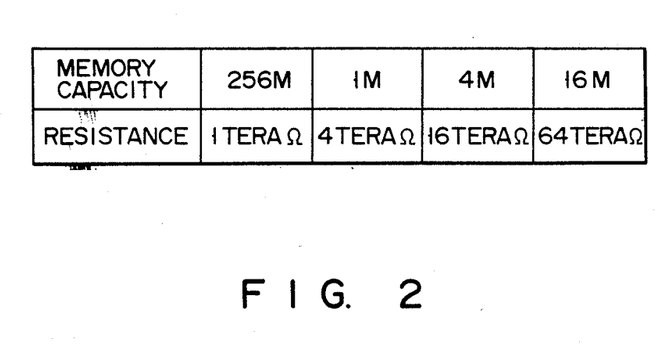
FIG. 2 is a table showing the relationship between the memory capacity of an E/R-type SRAM and the resistance of the high-resistance elements used in each memory cell of the E/R-type RAM.

FIG. 2 is a table showing the various resistances which elements R1 and R2 of each E/R type SRAM cell of an E/R type SRAM must have to maintain the current, which flows through the cell in the static condition, at the typical value of 1 $\mu$A, in accordance with the memory capacity of the E/R type SRAM. As may be understood from FIG. 1, memory nodes N1 and N2 exist in the PN junction between a P-type substrate and an N+diffusion region which is the common drain of transistors Q1 and Q2. The reverse leakage current flowing in this PN junction is about $10^{-14}$ A. This value is equivalent to resistance of about 100 tera $\Omega$. In the case of a 256 K-bit memory, the resistance of either high-resistance element, R1 or R2, is 100 times the resistance equivalent to the reverse leakage current flowing in the PN junction. In the case of a 1 M-bit memory, the resistance is 25 times the resistance which is equivalent to the reverse leakage current. The greater the ratio of the resistance of either high-resistance element, the larger the operation margin of each memory cell. As is evident from FIG. 2, this operation margin is inversely proportional to the capacity of the memory.

What has been explained in the preceding paragraph only applies to the case where no abnormal leakage currents flow in the PN junction connected to both memory nodes N1 and N2. In actuality, both a defective leakage current and a contaminating leakage current are generated in the PN junction. When these abnormal leakage currents are far greater than the currents flowing via high-resistance elements R1 and R2, neither memory node can no longer hold the data item "1", and the flip-flop circuit F ceases to function, and hence the E/R type SRAM cell having this flip-flop circuit F cannot correctly function. Any SRAM chip, if containing such a defective memory cell, can no longer function at all. Needless to say, the presence of such defective memory cells reduces the yield of SRAM chips.

On the hand, when the abnormal leakage currents are nearly equal to the currents flowing through high-resistance elements R1 and R2, the voltage applied on the memory node storing the data item "1" falls to the value determined by the division of resistance achieved by high-resistance elements R1 and R2 and also by the resistance equivalent to the abnormal leakage current. Consequently, flip-flop circuit F becomes very unstable, and the memory cell, as a whole, inevitably operates unstably. Any SRAM which includes such a defective memory cell has neither a sufficient margin for power-supply voltage nor a sufficient margin for temperature changes. Unless the defective memory cell is detected, and any appropriate measures are taken for the cell, the data stored in this defective cell will be destroyed eventually.

Here arises a problem. It is extremely difficult to detect a defective memory in the SRAM. As is known in the art, it takes a long period of time to complete the test for screening an inadequate operation margin or a defect which needs a long time to detect. In some cases, it is necessary to set the ambient temperature at various values to carry out this test successfully. In the worst case, the insufficient operation margin or the defect may not be found even if the test has been carried out for a considerably long time.

Figure 3:
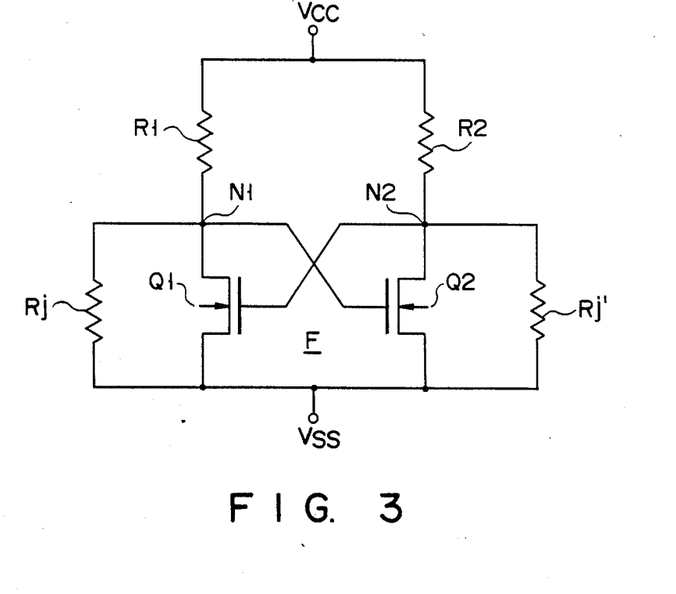
FIG. 3 is an equivalent circuit diagram showing part of the E/R-type SRAM cell illustrated in FIG. 1.

FIG. 3 is an equivalent circuit diagram showing the flip-flop circuit of an E/R type SRAM cell which is identical to the SRAM cell shown in FIG. 1, except that memory nodes N1 and N2 have a leakage-current path each. Resistors Rj and Rj' shown in this figures are equivalent to the leakage-current paths. More precisely, resistance Rj exists only when a reverse leakage current of a normal value flows through the PN junction coupled to memory node N1, whereas resistance Rj' exists only when a leakage current of an abnormal value flows through the PN junction connected to memory node N2.

Figure 4:
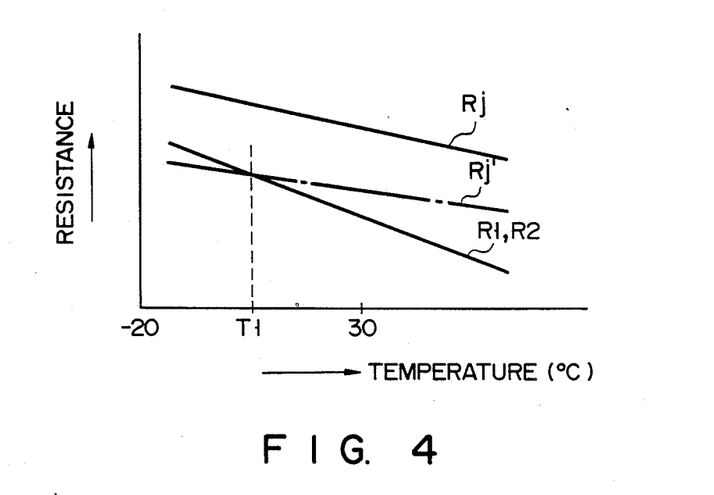
FIG. 4 is a diagram representing the temperature characteristics of the various resistors incorporated in the E/R-type SRAM cell shown in FIG. 1.

The typical temperature characteristics of resistors R1, R2, Rj, and Rj' are illustrated in FIG. 4. As can be understood from FIG. 4, the energy for activating high-resistance elements R1 and R2, each formed of a polycrystalline silicon layer, is great, and the temperature dependency of either high-resistance element is prominent. The resistance of resistor Rj is determined by the junction area of memory node N1, and is about 100 tera Ω. The temperature dependency of resistor Rj is less than that of high-resistance elements R1 and R2. Resistor Rj' has a resistance which is the sum of the resistance of resistor Rj and the resistance equivalent to the abnormal leakage current flowing through the PN junction. As is evident from FIG. 4, the line representing the temperature characteristic of resistor Rj' crosses the line representing the temperature characteristic of resistor Rj at a specific temperature T1 if the resistance of resistor Rj' is about hundreds of times lower than that of resistor Rj, said specific temperature T1 falling within the range in which the memory cell can correctly perform its function. In other words, resistor Rj' has the same resistance as elements R1 and R2 at temperature T1, a resistance lower than that of high-resistance elements R1 and R2 at any temperature below T1, and a resistance higher than that of elements R1 and R2 at any temperature above T1.

The voltage at which memory nodes N1 and N2 hold data when the memory cell is in its static condition will now be calculated. The voltage V1(1) which node N1 requires to hold data "1" can be given:

$$V1(1) = \left\{ \left( \frac{Rj \cdot Rn(\text{off})}{Rj + Rn(\text{off})} \right) / \left( \frac{Rj \cdot Rn(\text{off})}{Rj + Rn(\text{off})} + R1 \right) \right\} \cdot Vcc \quad (1)$$

The voltage V2(1) which node N2 requires to hold data "1" can be given:

$$V2(1) = \left\{ \left( \frac{Rj' \cdot Rn(\text{off})}{Rj' + Rn(\text{off})} \right) / \left( \frac{Rj' \cdot Rn(\text{off})}{Rj' + Rn(\text{off})} + R2 \right) \right\} \cdot Vcc \quad (2)$$

The voltage V1(0) which node N1 requires to hold data "0" can be given:

$$V1(0) = \left\{ \left( \frac{Rj \cdot Rn(\text{on})}{Rj + Rn(\text{on})} \right) / \left( \frac{Rj \cdot Rn(\text{on})}{Rj + Rn(\text{on})} + R1 \right) \right\} \cdot Vcc \quad (3)$$

The voltage V2(0) which node N2 requires to hold data "0" can be given:

$$V2(0) = \left\{ \left( \frac{Rj' \cdot Rn(\text{on})}{Rj' + Rn(\text{on})} \right) / \left( \frac{Rj' \cdot Rn(\text{on})}{Rj' + Rn(\text{on})} + R2 \right) \right\} \cdot Vcc \quad (4)$$

In the above equations (1) to (4), Rn(off) is the resistance equivalent to the channel leakage current which flows when transistors Q1 and Q2 of flip-flop circuit F are off, Rn(on) is the resistance equivalent to the channel current which flows when transistors Q1 and Q2 are on. Any transistor has Rn(off) as high as $10^{14}$ Ω or more if operating correctly. Hence, equations (1) to (4) can reduce to:

$$V1(1) \approx V_{CC} \quad (5)$$

$$V2(1) \approx \frac{Rj'}{Rj' + R2} \cdot V_{CC} \quad (6)$$

$$V1(0) = V2(0) \approx 0 \quad (7)$$

It is desirable that the voltages which each memory cell requires to store data "1" and data "0" be $V_{CC}$ and 0V, respectively. Voltage V2(1), at which memory node N2 holds data "1", is determined by Rj'/(R2+Rj'), and is lower than $V_{CC}$. The lower Rj' is than R2, the more does voltage V2(1) fall. When voltage V2(1) falls below the threshold voltage Vth of each N-channel MOS transistor, Rn(on), one of the terms of equation (3), changes to Rn(off). Consequently, voltage V1(0), at which memory node N1 holds data "0", will rise to $V_{CC}$ with time constant of R1·CA (where CA is the capacitance present in memory node N1). That is, data "0" held by node N1 has changed to "1", whereas data "1" held by node N2 has changed to "0". This is the destruction of data. In terms of the temperature characteristics shown in FIG. 4, the data is destroyed at temperature T1 or any lower temperature. This destruction of data is, hence, called "leakage induced cell destruction at low-temperature."

A SRAM memory cell which has undergone low-temperature pause destruction can hardly be detected unless the SRAM chip is tested not only at room temperature, but also at other various temperatures. It takes an extremely long time to test the SRAM chip at various temperatures, for a memory cell, if any, which has undergone leakage induced cell destruction at low-temperature. Obviously, it is uneconomical to spend much time on testing each SRAM chip. Further, a SRAM cell repeats unstable operation several times until the data stored in it is destroyed completely. This unstable operation of the cell is very hard to detect within a short period of time. Accordingly, demands have been made for means which can text a wafer having a number of SRAM chips, to determine quickly whether or not each SRAM chip contains any defective memory cell.

Hitherto, in order to detect defective memory cells, if any, contained in a SRAM chip, the operation characteristics of all cells of the SRAM chip are externally examined. This method can hardly be successful and requires a very long time to test the SRAM chip.

SUMMARY OF THE INVENTION

It is the object of the present invention to provide a static random access memory which has a means capable of accelerating the operating of each memory cell, thereby easily and quickly detecting defective memory cells having leakage current, if any.

According to an aspect of the invention, there is provided a static random access memory comprising: a semiconductor substrate, a well region formed in the substrate and containing at least one memory cell, and a power-supply terminal connected to the well region, for applying a given bias voltage to the well region.

DETAILED DESCRIPTION OF THE PREFERRED EMBODIMENTS

Figure 5:
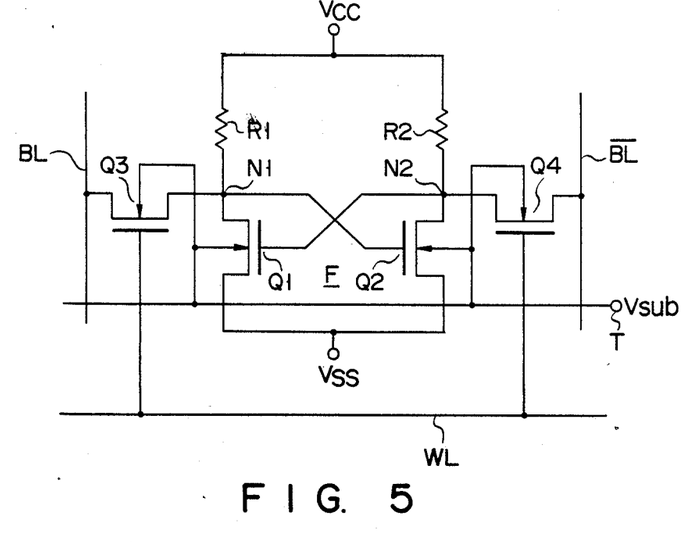
FIG. 5 is a circuit diagram illustrating each memory cell of the memory according to a first embodiment of the invention.

FIG. 5 shows one of the memory cells forming the cell array incorporated in a static random access memory according to the present invention. Like the memory cell shown in FIG. 1, this memory cell comprises four enhancement-type MOS transistors Q1 and Q4, and two high-resistance resistors R1 and R2. Transistors Q1 and Q2 are connected such that they form a flip-flop circuit F. The common source of these MOS transistors Q1 and Q2 is connected to ground voltage $V_{SS}$. MOS transistors Q3 and Q4, which are used as transfer gates, have their gates connected to word line WL. These transistors Q3 and Q4 are connected, at one end, to bit lines BL and $\overline{BL}$, respectively. As is shown in FIG. 5, the back gates of transistors Q1 to Q4 of each memory cell, i.e., the well region in which the memory cells are formed, are electrically isolated from the other well region in which peripheral circuits (later described) are formed. A power-supply terminal T is connected to the well region in which the memory cells are built, providing a predetermined bias voltage Vsub to the memory cells. As the bias voltage Vsub, a negative voltage lower than the ground voltage $V_{SS}$ is applied to the terminal T in order to detect cells which have undergone leakage induced cell destruction at low-temperature. As the bias voltage Vsub, a voltage at the same level as the power supply voltage $V_{CC}$ is applied to the terminal T in order to make the memory cells perform their function. The ground voltage $V_{SS}$ is always applied to the well region in which peripheral circuits (later described) are formed.

This scheme of applying different voltages to the power-supply terminal T is achieved by forming the terminal T on the chip, in the form of a bonding pad, and by externally applying the negative voltage onto the bonding pad to test the memory cells, and then connecting the bonding pad to the $V_{SS}$-applying lead frame after the test.

Figure 6:
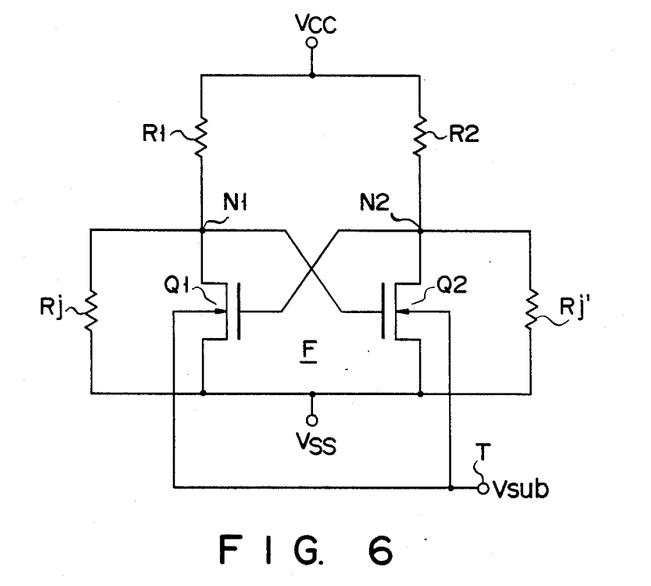
FIG. 6 is an equivalent circuit of the memory cell shown in FIG. 5.

FIG. 6 is an equivalent-circuit diagram illustrating that part of the equivalent circuit diagram shown in FIG. 5, which shows the flip-flop F, wherein a reverse leakage current of the PN junction flows through memory node N1, and a reverse leakage current containing an abnormal leakage component flows through memory node N2.

The SRAM chip having memory cells identical to the cell shown in FIG. 5 is tested in the following way. First, the voltage Vsub, which is equal to the ground voltage $V_{SS}$, is applied to the power-supply terminal T. At the same time, the power-supply voltages $V_{CC}$ and $V_{SS}$ are also applied to each memory cell. Under this condition, specific data is written into the memory cell by the method known in the art. More precisely, bit lines BL and $\overline{BL}$ are respectively set to the "0" potential and the "1" potential, or vice versa. As a result, MOS transistors Q3 and Q4, functioning as transfer gates, are turned on by the signal on the word line WL. Memory nodes N1 and N2 are set to the potentials of the bit lines BL and $\overline{BL}$, respectively. Then, the flip-flop circuit F maintains both potentials stably. Hence, the memory cell stores the specified data.

Figure 7:
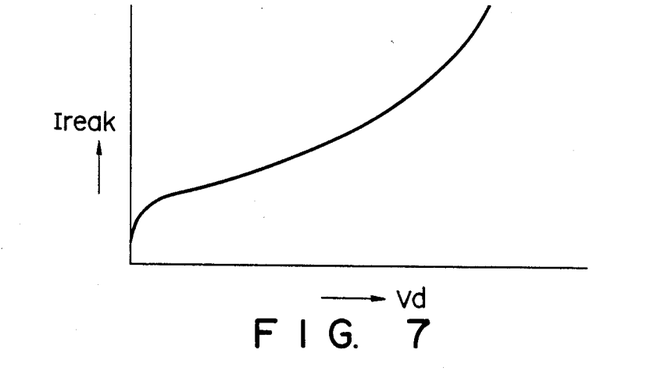
FIG. 7 is a graph representing a characteristic of the memory in FIG. 5.

Thereafter, the negative voltage is applied, as the voltage Vsub, to the power-supply terminal T. This voltage Vsub is applied to the back gates of transistors Q1 to Q4. When this negative voltage Vsub is applied to the back gate of transistor Q2, a current flows through memory node N2, which is greater than the current which flows via node N1 when the ground voltage $V_{SS}$ is applied to the back gate of transistor Q2. This may be clearly understood from FIG. 7 which is a graph representing the characteristic of the memory cell shown in FIG. 5, that is, the relationship between the abnormal junction leakage-current Ireak and the reverse voltage Vd applied to the PN junction. The voltage V2(1)', which holds data "1" in memory node N2 while the negative voltage is being applied as the voltage Vsub to terminal T is given, from equation (2):

$$V2(1)' = \frac{Rf}{Rf + R2} \cdot (V_{CC} - V\text{sub}) + V\text{sub} \qquad (8)$$

By subtracting V2(1) from V2(1)', we obtain:

$$V2(1)' - V2(1) = \frac{Rf}{Rf + R2} Vsub + Vsub \quad (9)$$

That is, when the voltage Vsub, which is a negative one, is applied to terminal T, the voltage of memory node N1 holding data "1" falls by the value given by equation (9). As has been stated, the ground voltage $V_{SS}$ is always applied to the region in which the peripheral circuits are formed. Among these peripheral circuits is a sense amplifier. The characteristic of the sense amplifier, which depends on the voltage applied to the well region, remains unchanged. Therefore, it is easy to detect the leakage induced cell destruction at low-temperature due to the fall of the data-holding voltage of memory node N2; the destruction can be detected merely by applying the voltage Vsub, which is lower than the voltage $V_{SS}$, to the back gates of transistors Q1 to Q4 forming each memory cell. This is because the destruction of the data stored in the memory cell starts when voltage V2(1)' falls below the threshold voltage of the N-channel MOS transistors, and the destruction of the data stored in the memory cell can be started by applying the voltage Vsub, which is lower than the ground voltage, to the back gates of transistors Q1 and Q4.

After the destruction of the data stored in the memory cell has been accelerated, the voltage $V_{SS}$ is applied, as the voltage Vsub, to the power-supply terminal T, thereby reading the data from the memory cell. The data stored in this cell remains unchanged even after the bias voltage Vsub has changed back to the ground voltage $V_{SS}$. Hence, if the data read from the memory cell is different from the data previously written into the cell, it is determined that this memory cell has undergone leakage induced cell destruction at low-temperature. To detect a defective memory cell it suffices to change the bias voltage Vsub. Therefore, the detection of such defective memory cells can be achieved within a far shorter time than is possible in the case of the prior art E/R type SRAM.

When the negative voltage is applied to the back gates of the N-channel MOS transistors, the threshold voltages of these transistors will increase. This phenomenon is generally known as "substrate-bias effect."

Figure 8:
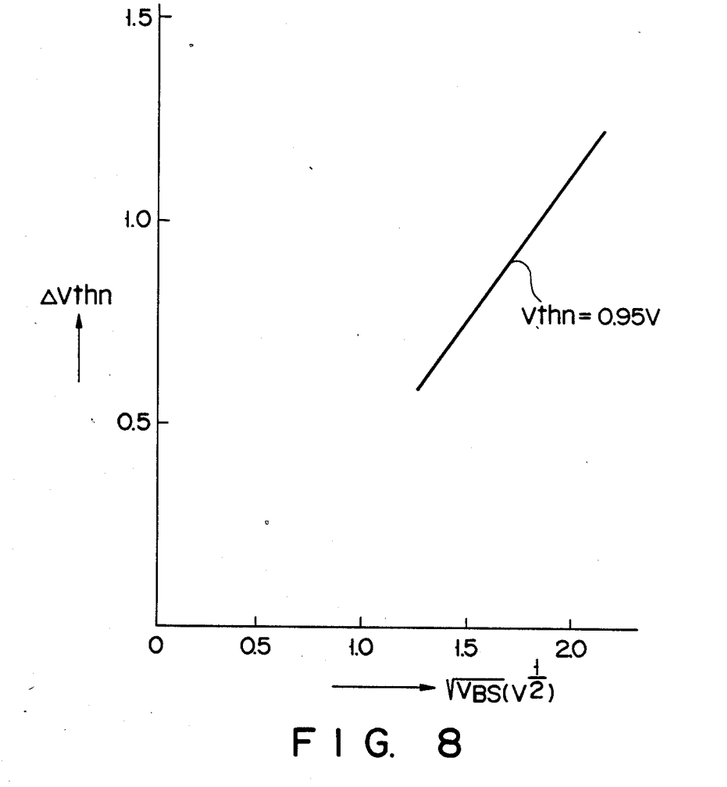
FIG. 8 is a graph illustrating another characteristic of the memory cell shown in FIG. 5.

FIG. 8 is a graph representing the relationship between value $\sqrt{V_{BS}(V^{\frac{1}{2}})}$ and value $\Delta Vthn$, which relationship is observed when a predetermined back-gate bias voltage is applied to an N-channel MOS transistor to change the threshold voltage $\Delta Vthn$ of this transistor to 0.95 V. The value $\sqrt{V_{BS}(V^{\frac{1}{2}})}$ is the square root of the voltage applied between the back gate and the source of the N-channel MOS transistor. The application of the negative voltage to the back gate of the transistor raises the threshold voltage of the transistor. Hence, when the voltage V2(1)' falls below the threshold voltage of the N-channel MOS transistor, the destruction of the data stored in the memory cell starts. The threshold voltage of the transistor, which has been raised by virtue of the substrate-bias effect accelerates the destruction of the data stored in the memory cell.

Figure 9:
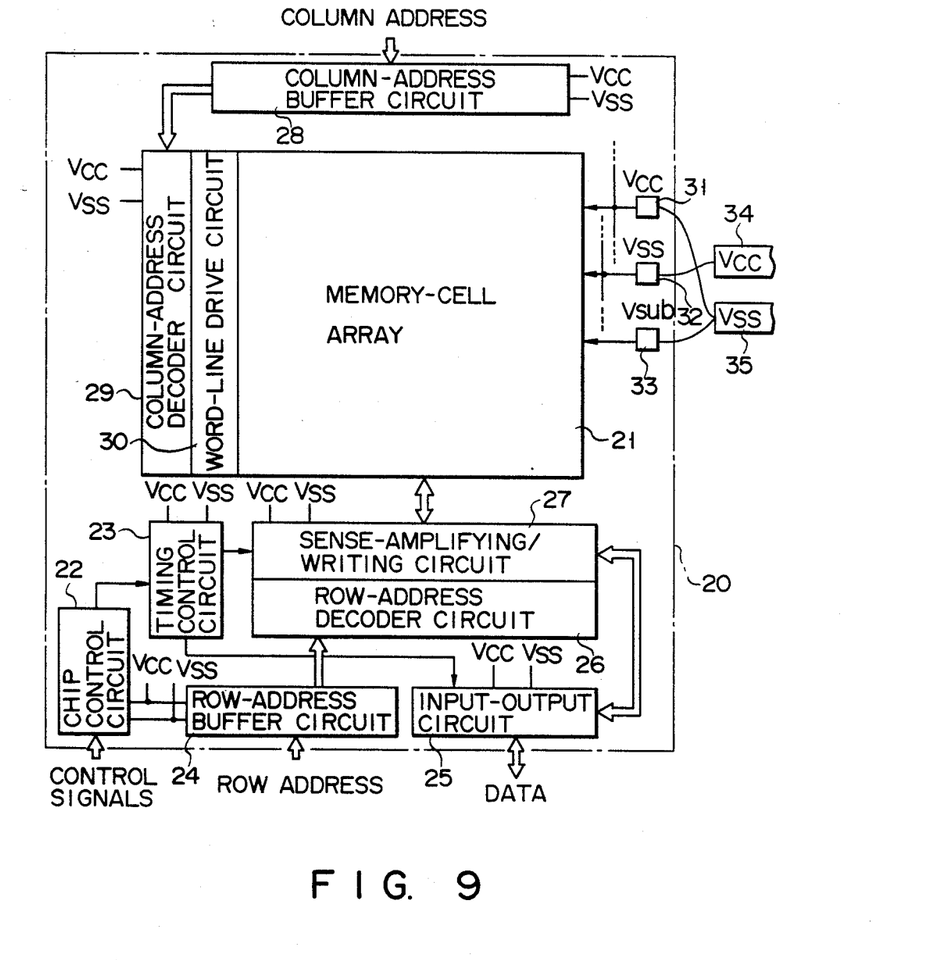
FIG. 9 is a block diagram showing the memory according to a first embodiment of the present invention, which has memory cells identical to the cell illustrated in FIG. 5.

FIG. 9 is a block diagram illustrating SRAM chip 20 according to the present invention, which has memory cells identical to the one shown in FIG. 5. More specifically, SRAM chip 20 comprises array 21 of memory cells (FIG. 5), and various peripheral circuits for controlling the writing of data into, and the reading of data from, each of the memory cells. Among these peripheral circuits, mostly known in the art, are: chip control circuit 22, timing control circuit 23, row-address buffer circuit 24, input-output circuit 25, row-address decoder circuit 26, sense-amplifying/writing circuit 27, column-address buffer circuit 28, column-address decoder circuit 29, and word-line drive circuit 30. Chip control circuit 22 is connected to receive various control signals such as a chip-enable signal and an output-enable signal. Timing control circuit 23 generates timing signals in response to the signal output by chip control circuit 22. Row-address buffer circuit 24 is connected to store row addresses. Input-output circuit 25 is designed to input data to SRAM chip 20 and output data therefrom. Row-address decoder circuit 26 decodes the row-address data output by row-address buffer circuit 24. Sense-amplifying/writing circuit 27 is used to write data into memory-cell array 21 and also to read data from memory-cell array 21. column-address buffer circuit 28 is connected to store column addresses. Column-address decoder circuit 29 decodes any column-address data output by column-address buffer circuit 28. Word-line drive circuit 30 drives the word lines provided in memory-cell array 21, in accordance with the data output by column-address decoder circuit 29.

As is shown in FIG. 9, SRAM chip 20 further comprises bonding pads 31, 32, and 33. Bonding pads 31, 32, and 33 function as power-supply terminals for applying the power-supply voltage $V_{CC}$, the ground voltage $V_{SS}$, and the bias voltage Vsub to cell array 21. Pad 33 is equivalent to the power-supply terminal T shown in FIG. 5. The power-supply voltage $V_{CC}$ is applied from pad 31 to memory-cell array 21 and also to the peripheral circuits. The ground voltage $V_{SS}$ is applied from pad 32 to memory-cell array 21 and to also the peripheral circuits. The bias voltage Vsub is applied from pad 33 to only the well region in which memory-cell array 21 is formed.

In order to test memory-cell array 21, predetermined voltages are externally applied to memory-cell array 21 via bonding pads 31, 32, and 33 which are kept disconnected from lead frames 34 and 35. Upon completion of the test, bonding pads 31 is connected to $V_{CC}$ lead frame 34 by means of a bonding wire, and pads 32 and 33 are connected the $V_{SS}$ lead frame 35 by means of bonding wires, as is illustrated in FIG. 9.

Figure 10A:
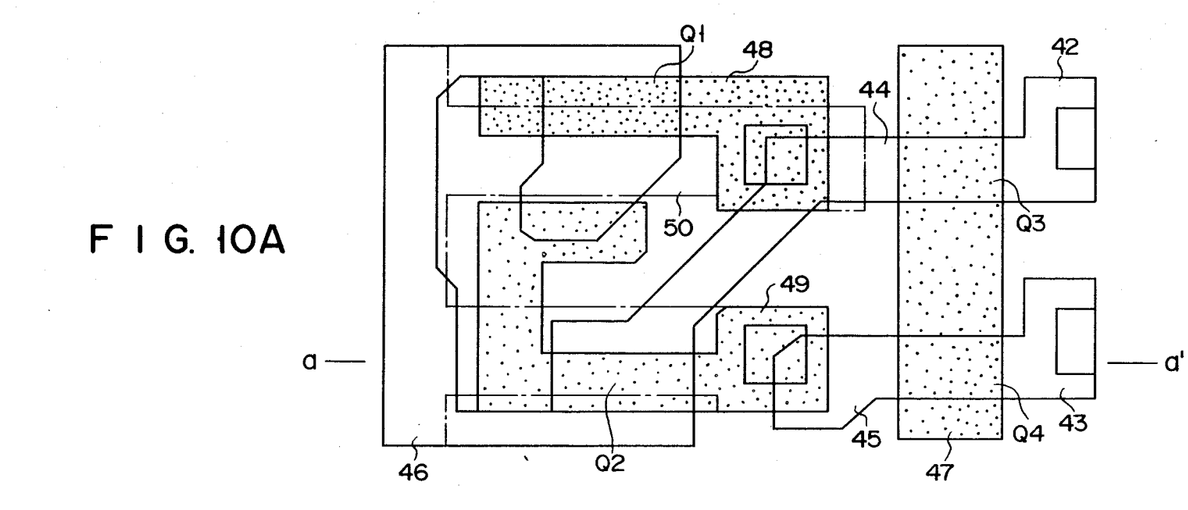
FIG. 10A is a plan view representing the element pattern in a portion, of the memory cell illustrated in FIG. 5.
Figure 10B:
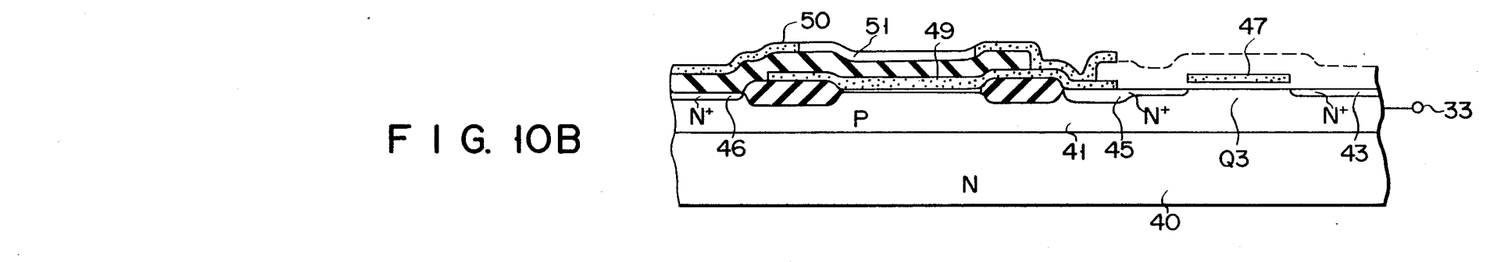
FIG. 10B is a cross-sectional view, taken along line a—a' in FIG. 10A.

FIGS. 10A and 10B illustrate the element pattern of that portion of the memory cell shown in FIG. 5. As is evident from these figures, the memory chip is formed of N-type semiconductor substrate 40. P-type well region 41 containing a number of memory cells of the type shown in FIG. 5 is formed in substrate 40. N+ diffusion regions 42, 43, 44, 45, and 46 are formed in P-type well region 41. Polycrystalline silicon layers 47, 48, and 49 are formed on P-type well region 41. N+ diffusion regions 42 and 43 are the sources or drains of MOS transistors Q3 and Q4, which re connected to bit lines BL and $\overline{BL}$. N+ diffusion regions 44 and 45 are the drains or the sources of MOS transistors Q3 and Q4, and also the drains of MOS transistors Q1 and Q2. N+ diffusion region 46 functions as the common source of MOS transistors Q1 and Q2. Polycrystalline silicon layers 47, 48, and 49 are located in a first plane, and polycrystalline silicon layers 50 is located in a second plane. Layer 47 is used as the gate electrodes of MOS transistors Q3 and Q4. Layer 48 functions as the gate electrode of MOS transistor Q1. Layer 49 functions as the gate electrode of MOS transistor Q2. Polycrystalline silicon layer 50 is used as high-resistance resistors R1 and R2 and also as a connecting line. The region 51 of layer 50 which is used as one of resistors R1 and R2 contains virtually no impurities, and has a resistance of about $10^{12}$ Ω, as has been pointed out. As is shown in FIG. 10B, pad 33, which functions as the power-supply terminal T for applying the voltage Vsub, is connected to P-type well region 41.

Another SRAM chip 20 according to the present invention will now be described, with reference to FIG. 11. The same elements as those shown in FIG. 9 are designated at the same reference numerals in FIG. 9, and will now described in detail.

Figure 11:
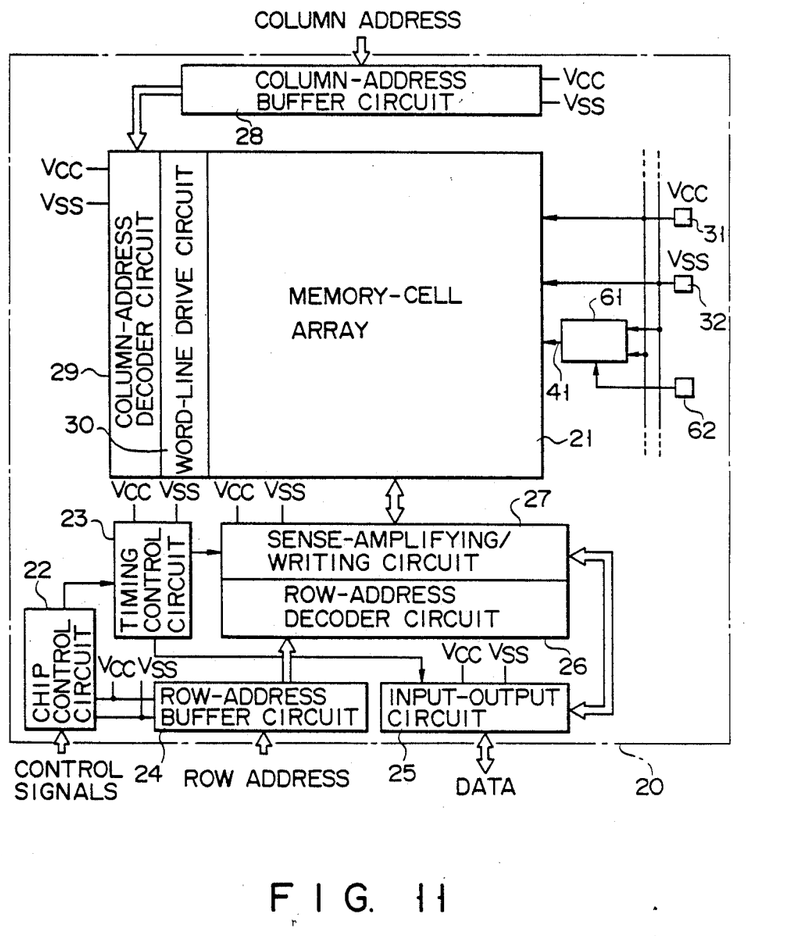
FIG. 11 is a block diagram showing the memory according to a second embodiment of the present invention.

SRAM chip 20 illustrated in FIG. 11 is characterized in that the output of bias-generating circuit 61 is connected to P-type well region 41 in which memory-cell array 21 is built. This circuit 61 is controlled by the signal supplied to bonding pad 62 formed on the chip.

When the control signal supplied to bonding pad 62 is set at the "0" level, bias-generating circuit 61 generates the negative voltage Vsub. When the control signal supplied to bonding pad 62 is set at the "1" level, circuit 61 generates the ground voltage $V_{SS}$, which will be used as the voltage Vsub.

Figures 12, 13:
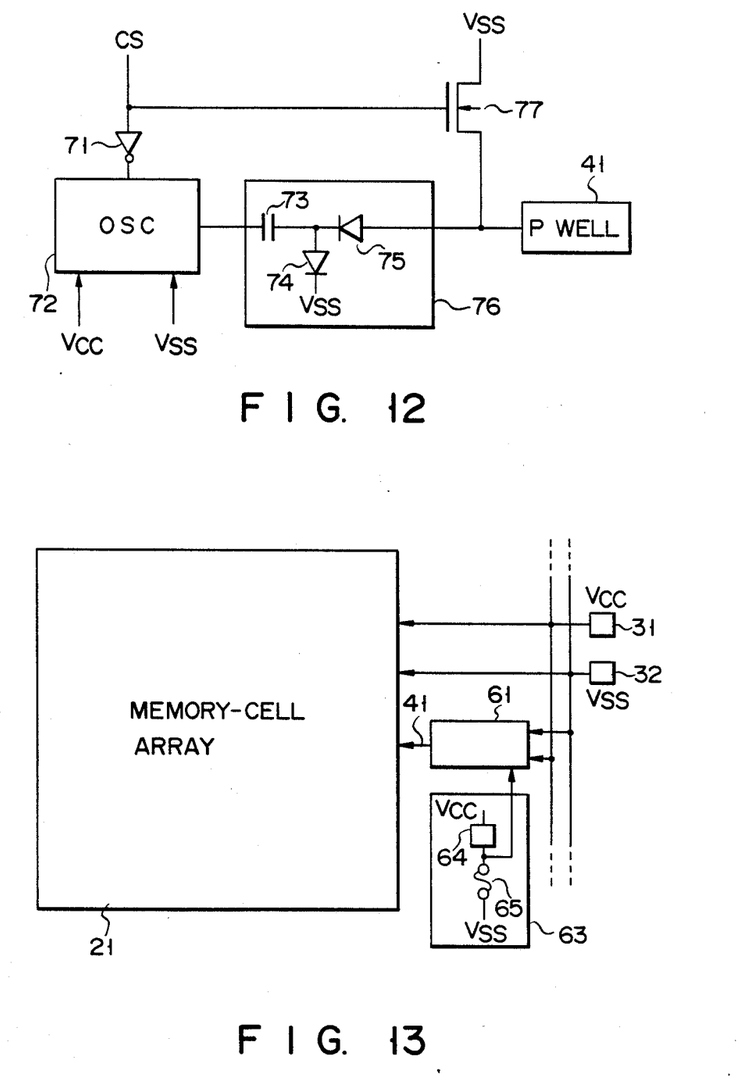
FIG. 12 is a circuit diagram showing part of the memory shown in FIG. 11.
FIG. 13 is a block diagram showing the memory according to a third embodiment of the present invention.

As is shown in FIG. 12, bias voltage-generating circuit 61 comprises inverter 71, oscillator 72, charger-pump circuit 76, and N-channel MOS transistor 77. Inverter 71 inverts the control signal CS supplied to bonding pad 62. Oscillator 72 generates a square-wave signal having a predetermined frequency, when the signal output by inverter 71 is at the "1" level. Charge-pump circuit 76 has capacitor 73 and two diodes 74 and 75. Circuit 76 generates and applies a negative voltage, as the voltage Vsub, to well region 41 in response to the signal output by oscillator 72. N-channel MOS transistor 77 is coupled between the source of the ground voltage $V_{SS}$ and well region 41, and has its gate connected to receive the control signal CS from bonding pad 62.

When the control signal CS is at the "1" level, MOS transistor 77 is on, whereby the ground voltage $V_{SS}$ is applied as the voltage Vsub to well region 41. On the other hand, when the control signal CS is at the "0" level, MOS transistor 77 is off, and oscillator 72 generates and supplies a square-wave signal of a predetermined frequency to charge-pump circuit 76. In response to this square-wave signal, charge-pump circuit 76 generates a negative voltage.

Now, a fourth embodiment of the present invention will be described with reference to FIG. 13, which shows a part of the SRAM chip 20 according to this embodiment. The same elements as those shown in FIG. 11 are designated at the same reference numerals in FIG. 11, and will now describe in detail. As is shown in FIG. 13, bias-generating circuit 61 is controlled by the control signal output by control-signal generating circuit 63. This circuit 63 comprises a serial circuit consisting of load circuit 64 and fuse 65 and coupled between the sources of power-supply voltages $V_{CC}$ and $V_{SS}$.

As long as fuse 65 remains intact, control-signal generating circuit 63 supplies a control signal at the "0" level to bias-voltage generating circuit 61. In response to this control signal, circuit 61 generates a negative voltage, which is applied as the voltage Vsub. When fuse 65 is cut, control-signal generating circuit 63 supplies a control signal at the "1" level, to bias-generating circuit 61. In response to this control signal, circuit 61 generates the ground voltage $V_{SS}$ which will be used as the voltage Vsub. In this embodiment, bias-generating circuit 61 outputs either the voltage $V_{SS}$ or a negative voltage, in accordance with the level of the control signal supplied from the control-signal generating circuit 63. Nonetheless, circuit 61 can be designed to generate two predetermined different voltages, one of which is output in accordance with the control signal.

As has been described above, the present invention can provide a static random access memory which has a means of capable of easily and quickly detecting defective memory cells, if any, which have undergone leakage induced cell destruction at low-temperature.

What is claimed is:

1. A static random access memory comprising:
   a semiconductor substrate;
   a well region formed in the substrate and containing at least one memory cell; and
   a bonding pad formed on the substrate and connected to the well region, and to which a bias voltage to be applied to the well region is applied.

2. A static random access memory comprising:
   a semiconductor substrate;
   a well region formed in the substrate and containing at least one memory cell;
   bias-voltage generating means connected to the well region for generating a bias voltage to be applied to the well region; and
   a bonding pad formed on the substrate, to which a control signal for controlling the bias-voltage generated by the bias-voltage generating means is supplied.

3. The static random access memory according to claim 1, wherein said at least one memory cell includes a flip-flop circuit comprising two inverters, each inverter including a resistor and a MOS transistor used as a resistance element and a drive element, respectively.

4. The static random access memory according to claim 1, further comprising means for applying a power-supply voltage to said memory cell.

5. The static random access memory according to claim 2, wherein said at least one memory cell includes a flip-flop circuit comprising two inverters, each inverter including a resistor and a MOS transistor used as a resistance element and a drive element, respectively.

6. The static random access memory according to claim 2, further comprising means for applying a power-supply voltage to said memory cell.

7. The static random access memory according to claim 4, wherein said bias voltage is lower than the lowest power-supply voltage applied to said memory cell.

8. The static random access memory according to claim 6, wherein said bias-voltage generating means generates a bias voltage lower than the lowest power-supply voltage applied to said memory cell.

* * * * *